US 6,566,270 B1

(12) United States Patent
Liu et al.

(10) Patent No.: US 6,566,270 B1
(45) Date of Patent: May 20, 2003

(54) INTEGRATION OF SILICON ETCH AND CHAMBER CLEANING PROCESSES

(75) Inventors: Wei Liu, San Jose, CA (US); Scott Williams, Sunnyvale, CA (US); Stephen Yuen, Santa Clara, CA (US); David Mui, San Jose, CA (US); Meihua Shen, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/662,677

(22) Filed: Sep. 15, 2000

(51) Int. Cl.$^7$ ............................................. H01L 21/302
(52) U.S. Cl. ...................... 438/706; 438/714; 438/719; 134/1.1; 134/1.2
(58) Field of Search ............................. 438/706, 692, 438/693, 712, 714, 717, 719, 723, 724, 725; 134/1.1, 1.2

(56) References Cited

U.S. PATENT DOCUMENTS

| | | | | |
|---|---|---|---|---|
| 4,985,113 A | * | 1/1991 | Fujimoto et al. | 156/643 |
| 5,158,644 A | * | 10/1992 | Cheung et al. | 156/643 |
| 5,522,966 A | * | 6/1996 | Komura et al. | 156/662.1 |
| 5,626,775 A | * | 5/1997 | Roberts et al. | 438/721 |
| 6,127,278 A | * | 10/2000 | Wang et al. | 438/719 |
| 6,235,213 B1 | * | 5/2001 | Allen, III | 438/714 |
| 6,318,384 B1 | * | 11/2001 | Khan et al. | 134/22.1 |

* cited by examiner

Primary Examiner—Robert Kunemund
Assistant Examiner—Duy-Vu Deo
(74) Attorney, Agent, or Firm—Townsend, Townsend & Crew; Joseph Bach

(57) ABSTRACT

A method for processing a substrate disposed in a substrate process chamber having a source power includes transferring the substrate into the substrate process chamber. A trench is etched on the substrate by exposing the substrate to a plasma formed from a first etchant gas by applying RF energy from the source power system and biasing the plasma toward the substrate. Byproducts adhering to inner surfaces of the substrate process chamber are removed by igniting a plasma formed from a second etchant gas including a halogen source in the substrate process chamber without applying bias power or applying minimal bias power. Thereafter, the substrate is removed from the chamber. At least 100 more substrates are processed with the etching-a-trench step and removing-etch-byproducts step before performing a dry clean or wet clean operation on the chamber.

26 Claims, 10 Drawing Sheets

WAFER 0

NO SOFT CLEAN STEP

WITH SOFT CLEAN STEP

INTEGRATION OF SILICON ETCH AND CHAMBER CLEANING PROCESSES

BACKGROUND OF THE INVENTION

The present invention relates to a method of etching silicon. More specifically, the present invention relates to a method of integrating silicon etch and chamber cleaning processes.

A silicon etch process is a fundamental step in fabricating many integrated circuits. An important consideration in the etch process is repeatability since each substrate processed must have a substantially identical etch profile to conform to a precise design specification. However, the repeatability of a silicon etch process is complicated because the silicon etch process is generally a "dirty" process which generates byproducts, such as silicon dioxide, which adhere to the inner surfaces of the etch chamber. This adhesion on the inner surfaces accumulates with each successive silicon etch process and alters the chamber condition. Unless the chamber is cleaned regularly, the chamber eventually becomes dirty which may lead to poor repeatability. For example, a substrate processed at an early stage might have different etch profiles than substrates processed later when the chamber is dirty.

In order to solve these and other problems associated with the byproduct accumulation, chamber cleaning processes are regularly performed between etch processes. For example, a dry clean process may be performed after processing one to three cassettes, where each cassette contains about twenty-five substrates. The dry clean process generally involves inserting a dummy substrate into the chamber and igniting a plasma from a cleaning gas mixture within the chamber. The plasma removes the byproducts adhering to the inner surfaces of the chamber to return the chamber to a relatively clean state.

In addition to the dry clean process, a wet clean process is periodically performed, e.g., after processing every 1,500 substrates, since the dry clean process generally cannot effectively clean the entire chamber. The wet clean process involves opening the chamber and manually cleaning the chamber with solvents. This process generally takes between four to eight hours. After the wet clean process, the etch chamber is "seasoned" to obtain good repeatability. The chamber is seasoned by inserting a dummy substrate into the chamber and then igniting a plasma from a cleaning gas mixture.

As can be readily appreciated, the cleaning processes described above, particularly the wet clean process, take the etch system out of production and reduce the throughput. Accordingly, it is desirable to develop a silicon etch process that can process more substrates between wet clean steps and thereby minimize chamber down time.

SUMMARY OF THE INVENTION

The present invention provides an improved method for etching silicon. Embodiments of the invention integrate a silicon etch process with an in-situ cleaning process, so that a separate dry clean process need not be performed. The method allows more trench-etch process runs between chamber clean processes. The present invention may be used for any silicon etch process.

In one embodiment of the present invention, a method for processing a silicon substrate disposed in a substrate process chamber of the type having a source power includes transferring the substrate into the substrate process chamber. A trench is etched on the substrate by exposing the substrate to a plasma formed from a first etchant gas by applying RF energy from the source power system and biasing the plasma toward the substrate. Byproducts adhering to inner surfaces of the substrate process chamber are removed by igniting a plasma formed from a second etchant gas including a halogen source in the substrate process chamber without applying bias power or applying minimal bias power. Thereafter, the substrate is removed from the chamber. At least 100 more substrates are processed with the etching-a-trench step and removing-etch-byproducts step before performing either a dry clean or wet clean operation on the chamber.

In another embodiment, a method of integrating substrate processing and chamber cleaning steps includes transferring the substrate into the process chamber. The substrate is exposed to a plasma ignited from a first process gas to etch the substrate by applying bias power to the process chamber. Etch byproducts adhering to the process chamber are removed by exposing the chamber to ions and radicals dissociated in a second plasma formed from a second process gas which includes a halogen gas, without applying bias power or by applying minimal biasing power to the process chamber. Thereafter, the processed substrate is removed from the chamber. At least 3000 more substrates are processed with the exposing-the-substrate step and removing-etch-byproducts step before performing either a dry clean or wet clean operation on the chamber.

In another embodiment, a method of forming a trench on a silicon substrate disposed in a substrate process chamber of the type having a source power includes exposing the substrate to a plasma formed from a first etchant gas by applying RF energy from a source power system. The plasma is biased toward the substrate by applying bias power to the substrate process chamber to etch the trench. A plasma is ignited from a second etchant gas consisting essentially of $CF_4$, $O_2$ and Ar in the substrate process chamber without applying bias power or by applying minimal bias power to remove etch byproducts adhering to inner surfaces of the substrate process chamber.

These and other embodiments of the present invention, as well as its advantages and features, are described in more detail in conjunction with the text below and attached figures.

For a further understanding of the present invention, reference should be made to the ensuing detailed description.

DESCRIPTION OF THE SPECIFIC EMBODIMENTS

I. Exemplary Chamber

Figure 1A:
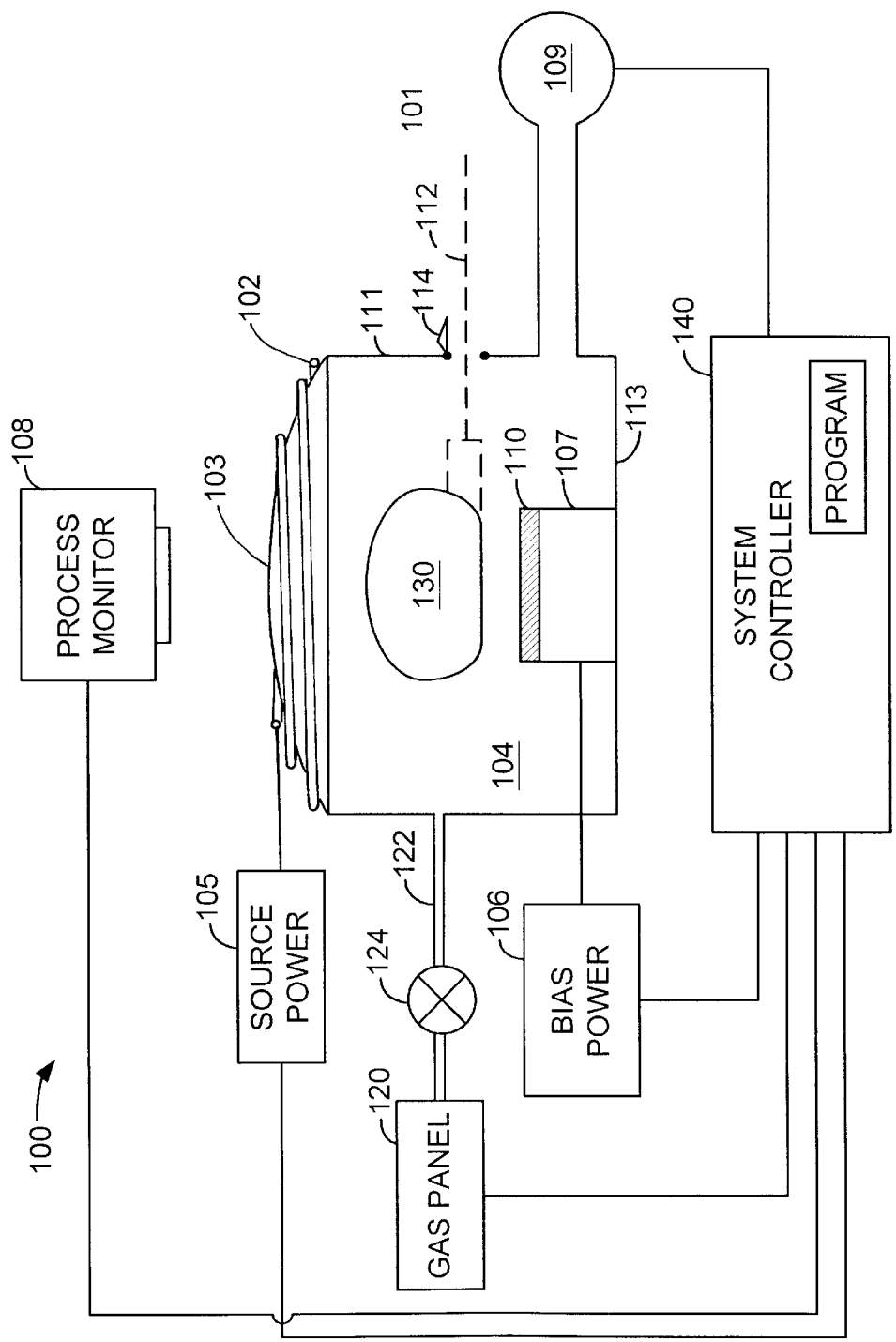
FIG. 1A shows a partial cross-sectional schematic of an exemplary semiconductor wafer processing system in which the method of the present invention may be implemented.

FIG. 1A depicts a schematic diagram of an exemplary semiconductor wafer processing system 100 in which the method of the present invention can be practiced. System 100 comprises a process chamber 101, a source power supply 105, a bias power supply 106 and a controller 140. Process chamber 101 comprises a process volume 104 defined by a dome 103, a cylindrical sidewall 111, and a bottom 113. Dome 103 is typically made of a dielectric material such as ceramic or quartz. Sidewall 111 and bottom 113 are typically made of a metal such as aluminum or stainless steel. Source power supply 105 couples an RF signal (e.g., 12.56 MHz) to an antenna 102. Antenna 102 has a plurality of turns located proximate the top 103 and produces RF electromagnetic fields that excite a process gas (or gases) located in volume 104 to form and/or sustain a plasma 130.

A robot arm 112, shown in phantom, transfers the wafers 110 in and out of process chamber 101 through a slit valve 114. During substrate processing, a semiconductor wafer 110, which may contain partially formed integrated circuit structures, is supported upon a pedestal (electrostatic chuck) 107. Wafer 110 is exposed to the plasma to facilitate processing. Ions and electrons from the plasma 130 bombard the wafer 110. Since the electrons are more mobile than the ion, more electrons than ions strike the wafer. As a result wafer 110 acquires a negative bias. The negative bias accelerates positive ions from the plasma towards wafer 110. Pedestal 107 and thus the wafer is biased by an RF signal (e.g., 400 KHz or 13.56 MHz) supplied to pedestal 107 by bias power supply 106. The density of ions in plasma 130 is primarily controlled by the signal applied to antenna 102, while the energy of the ions is primarily controlled by the signal applied to pedestal 107.

Temperature within chamber 101 is partly controlled by circulating a fluid (e.g., water-based ethylene glycol) through separate heat exchange passages (not shown) within sidewall 111 and dome 103 of the chamber. Temperature of the substrate being etched is controlled by a combination of a gas applied to the backside of the substrate through passages (not shown) within pedestal 107 and by circulating a fluid through a heat exchange passage (not shown) within the pedestal.

A process monitor 108 monitors conditions within process chamber 101. The process monitor can be any sensor, or combination of sensors, for measuring a condition that is dependent on the process occurring within chamber 101. By way of example, process monitor 108 is an Optical Emission Spectrometer (OES). The OES monitors emission of radiation from plasma 130. Such radiation is dependent on the progress of the process occurring in process chamber 101. Alternatively, process monitor 108 could include an interferometer for measuring elevations such as the depth of trenches etched into a surface of the wafer 110. Such an interferometer measures the depth of the trenches by interference of light reflected from the top and bottom of the trenches. If process monitor 108 is an OES or interferometer, radiation from within chamber 101 is coupled to the process monitor through a transparent aperture such as sapphire or quartz top 103. Alternatively a separate window can be provided in top 103 or sidewall 111 for this purpose.

Process monitor 108 and various components of system 100 are coupled to controller 140. Controller 140 includes hardware to provide the necessary signals to initiate, monitor, regulate, and terminate the processes occurring in process chamber 101. Process chamber 101 is, for example, a decoupled plasma source (DPS) etch chamber manufactured by Applied Materials of Santa Clara, Calif. Chamber 101 contains the elements necessary to process a semiconductor wafer.

The exterior of chamber 101 is typically at ambient atmospheric pressure and the interior of chamber 101 is held at a reduced pressure during processing. An exhaust system 109 regulates the pressure within chamber 101. A gas panel 120 delivers process gases to chamber 101 via a gas line 122 and a valve 124. In a process, such as an etch process, plasma 130 is formed in the chamber 101 by applying RF power to the process gas. RF power source 105 energizes antenna 102 to ignite and sustain the plasma within chamber 101. Those skilled in the art will realize that a plurality of steps is necessary to excite a plasma in a process chamber, i.e., supply a process gas, apply source power to the antenna, apply bias power to the pedestal and so on. These steps are within the skill of an ordinary practitioner in the art to perform without further explanation.

Figure 1B:
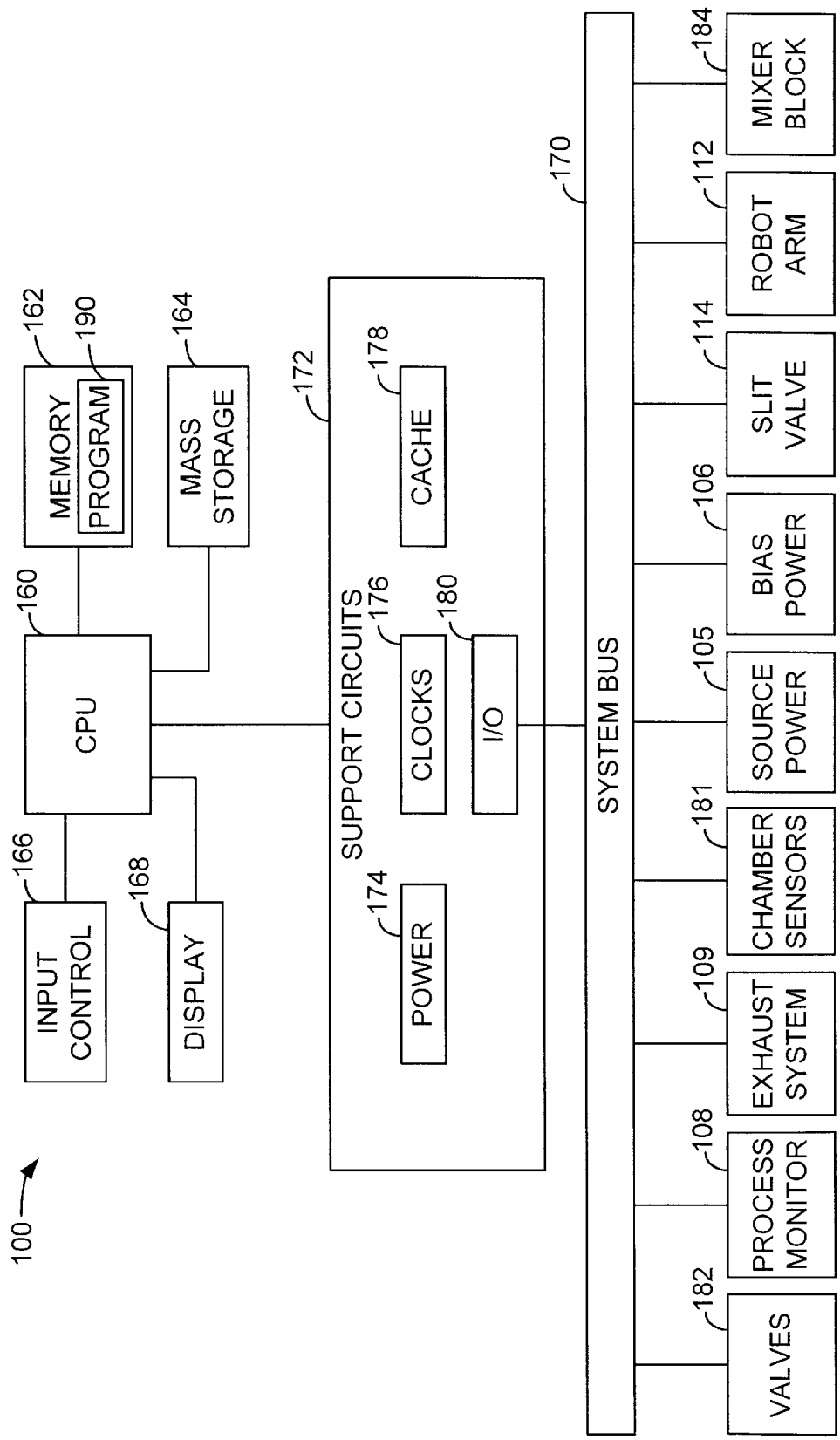
FIG. 1B shows a block diagram of the semiconductor wafer processing system of FIG. 1A.

The method of the present invention can be implemented in a system that is controlled by a processor-based system controller such as controller 140 of FIG. 1A. FIG. 1B shows a block diagram of a processing system 100, such as that depicted in FIG. 1A, having such a system controller 140 that can be employed in such a capacity. System controller unit 140 includes a programmable central processing unit (CPU) 160 that is operable with a computer-readable memory 162, a mass storage device 164, an input control unit 166, and a display unit 168. The system controller further includes well-known support circuits 172 such as power supplies 174, clocks 176, cache 178, input/output (I/O) circuits 180 and the like. Controller 140 also includes hardware for monitoring wafer processing through sensors 181 in chamber 101. Such sensors measure system parameters such as wafer temperature, chamber atmosphere pressure and the like. All of the above elements are coupled to a control system bus 170.

Memory 162 contains instructions that CPU 160 executes to control the operation of processing system 158. The instructions in memory 162 are in the form of program code such as a program 190 that implements the method of the present invention. The program code may conform to any one of a number of different programming languages. For example, the program code can be written in C, C++, BASIC, Pascal, or a number of other languages. Computer program 190 may include a number of different subroutines. For example, in one specific embodiment, program 190 includes a process selection subroutine, a process sequencer subroutine and chamber manager subroutines for each chamber in a multichamber system. Program 190 also includes subroutines to control individual components of each chamber 101, including, for example, a substrate positioning subroutine, a process gas control subroutine, a pressure control subroutine, a temperature control subroutine, and a plasma control subroutine among others. Those having ordinary skill in the art will readily recognize that other chamber control subroutines can be included depending on what processes are to be performed in process chamber 101.

The process selection subroutine identifies (i) the desired process chamber (if chamber 101 is part of a multichamber processing system) and (ii) the desired set of process parameters needed to operate the process chamber for performing the desired process. The process parameters for performing a specific process relate to process conditions such as, process gas composition and flow rates, temperature, pressure, plasma conditions such as RF power levels and the low frequency RF frequency, cooling gas pressure, and chamber wall temperature. These parameters are provided to the user in the form of a recipe and can be entered using input control interface 166.

The process sequencer subroutine includes program code for accepting the identified process chamber and set of process parameters from the process selector subroutine and for controlling operation of the various process chambers in a multichamber system. Multiple users can enter process set numbers and process chamber numbers, or a user can enter multiple process set numbers and process chamber numbers, so the sequencer subroutine operates to schedule the selected processes in the desired sequence. Preferably, the sequencer subroutine includes program code to (i) monitor the operation of the process chambers to determine if the chambers are being used, (ii) determine what processes are being carried out in the chambers being used, and (iii) execute the desired process based on availability of a process chamber and type of process to be carried out. Conventional methods of monitoring the process chambers can be used, such as polling. When scheduling which process is to be executed, the sequencer subroutine can take into consideration the present condition of the process chamber being used in comparison with the desired process conditions for a selected process, or the "age" of each particular user-entered request, or any other relevant factor a system programmer desires to include for determining scheduling priorities.

Once the sequencer subroutine determines which process chamber and process set combination is going to be executed next, the sequencer subroutine initiates execution of the process set by passing the particular process set parameters to a particular chamber manager subroutine that controls multiple processing tasks in the particular process chamber according to the process set determined by the sequencer subroutine. In operation, the chamber manager subroutine selectively schedules or calls the process component subroutines in accordance with the particular process set being executed. Typically, the chamber manager subroutine monitors the various chamber components, determines which components need to be operated based on the process parameters for the process set to be executed, and initiates execution of individual chamber component subroutines responsive to the monitoring and determining steps.

A person of ordinary skill in the art would understand how to implement each of the particular chamber component subroutines. For example, the substrate positioning subroutine would include program code for controlling chamber components that are used to load the substrate onto pedestal 107 and, optionally, to lift the pedestal and substrate to a desired height in chamber 101 for substrate processing.

Mass storage device 164 stores data and instructions and retrieves data and program code instructions from a processor readable storage medium, such as a magnetic disk or magnetic tape. For example, the mass storage device 164 can be a hard disk drive, floppy disk drive, tape drive, or optical disk drive. Mass storage device 164 stores and retrieves the instructions in response to directions that it receives from the CPU 160. Data and program code instructions that are stored and retrieved by mass storage device 164 are employed by processor unit 160 for operating the processing system 100. The data and program code instructions are first retrieved by the mass storage device 164 from a medium and then transferred to memory 162 for use by CPU 160.

Input control unit 166 couples a data input device, such as a keyboard, mouse, or light pen, to processor unit 160 to provide for the receipt of a chamber operator's inputs. Display unit 168 provides information to a chamber operator in the form of graphical displays and alphanumeric characters under control of CPU 160.

Control system bus 170 provides for the transfer of data and control signals between all of the devices that are coupled to the control system bus 170. Although the control system bus is displayed as a single bus that directly connects the devices in CPU 160, control system bus 170 can also be a collection of busses. For example, display unit 168, input control unit 166 and mass storage device 164 can be coupled to an input-output peripheral bus, while CPU 160 and memory 162 are coupled to a local processor bus. The local processor bus and input-output peripheral bus are coupled together to form control system bus 170.

System controller 140 is coupled to the elements of the processing system 100, employed in etch processes in accordance with the present invention via system bus 170 and I/O circuits 180. These elements include a plurality of valves 182 (such as valve 124 of FIG. 1A), process monitor 108, exhaust system 109, source power supply 105, bias power supply 106, slit valve 114, gas panel 120, robot arm 112, chamber sensors 181 and an optional mixer block 184 (not shown in FIG. 1A, but may be connected to either the gas panel 120 or chamber 101).

System controller 140 provides signals to the various chamber elements that cause these elements to perform desired operations in order to implement a desired process in chamber 101.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, in software, hardware, or both. Those skilled in the art will also realize that it would be a matter of routine skill to select an appropriate computer system to control substrate processing system 100.

II. Silicon Processing According to the Present Invention

The method of the present invention can be used to etch silicon for a variety of applications in appropriate substrate processing chambers such as the exemplary chamber described above. However, for illustrative purposes, the present invention is described below in conjunction with etching trenches in a silicon substrate for a shallow trench isolation process. Where applicable, reference numbers in the description below are used to refer to appropriate components of the exemplary chamber shown in FIGS. 1A and 1B.

Figure 2A:
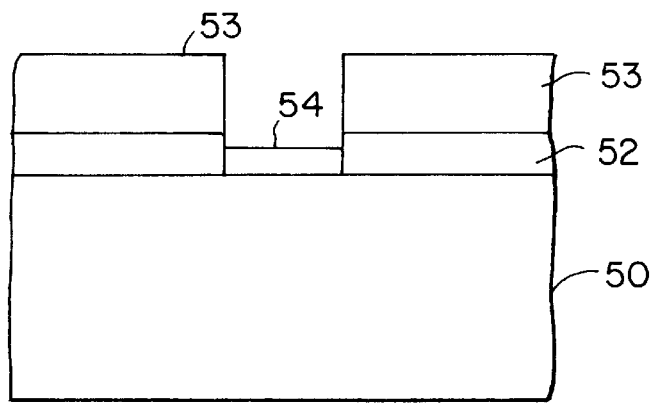
FIG. 2A shows a simplified cross-sectional view of a semiconductor substrate having a patterned hard mask.
Figure 2B:
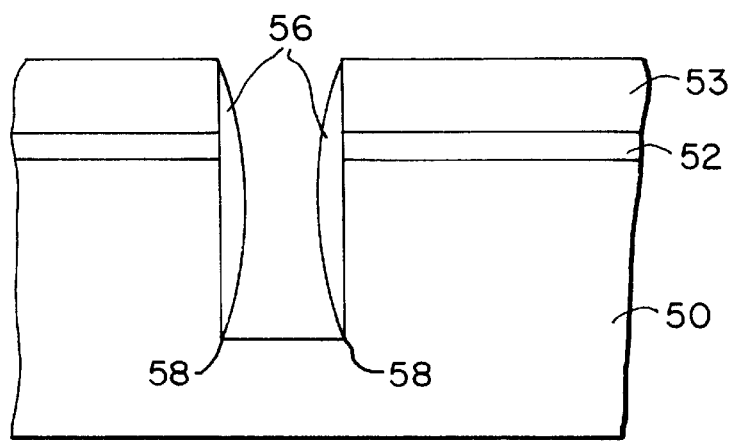
FIG. 2B shows a simplified cross-sectional view of the semiconductor substrate of FIG. 2A after a trench has been etched thereon.

Referring to FIGS. 2A–C and FIG. 3, a process 200 (FIG. 3) includes placing a substrate 50 (FIG. 2A) on pedestal 107 of process chamber 101 (step 201). The substrate has a patterned pad oxide layer 52 and a patterned hard mask layer 53, e.g., a silicon nitride layer, provided thereon by well-known techniques. The pad oxide layer is formed on the substrate to provide a good adhesive surface for the hard mask layer. A native oxide layer 54 is formed on the exposed portion of substrate 50 as a result of the substrate's exposure to air. Native oxide layer 54 is first removed using a well-known etch technique called break through step (step 202). Then, a trench is etched using a well-known anisotropic etch technique (step 204), as shown in FIG. 2B. The anisotropic etch technique involves applying a bias power to direct the ions vertically toward the substrate and flowing polymer-forming gases such as oxygen and nitrogen into chamber 101 to form a passivation layer 56 on the walls of the trench as the trench is being etched. Generally the plasma is biased at at least 250 Watts (0.80 Watts/cm$^2$) in order to accelerate the ions vertically toward the substrate. The passivation layer generally tapers off at bottom corners 58 of the trench; i.e., the passivation layer is thicker at the upper sidewalls than the at the lower sidewalls.

The process recipe for one implementation of the trench etch process that uses an etchant gas consisting of $Cl_2$, $N_2$ and $O_2$ to etch a 4,000 Å trench is provided in Table 1 below. In Table 1, $W_b$ represents the bias power applied by bias power supply 106, $W_s$ represents source power supplied by source power supply 105, and Pressure represents the pressure within the chamber during the etch process.

TABLE 1

| Process Recipe | |
|---|---|
| | Trench Etch |
| Pressure | 30 mT |
| $W_b$ | 250 Watts |
| | (0.80 Watts/cm$^2$) |
| $W_s$ | 1000 Watts |
| $Cl_2$ | 90 sccm |
| $N_2$ | 20 sccm |
| $O_2$ | 6 sccm |
| Time | 45 sec |

Figure 3:
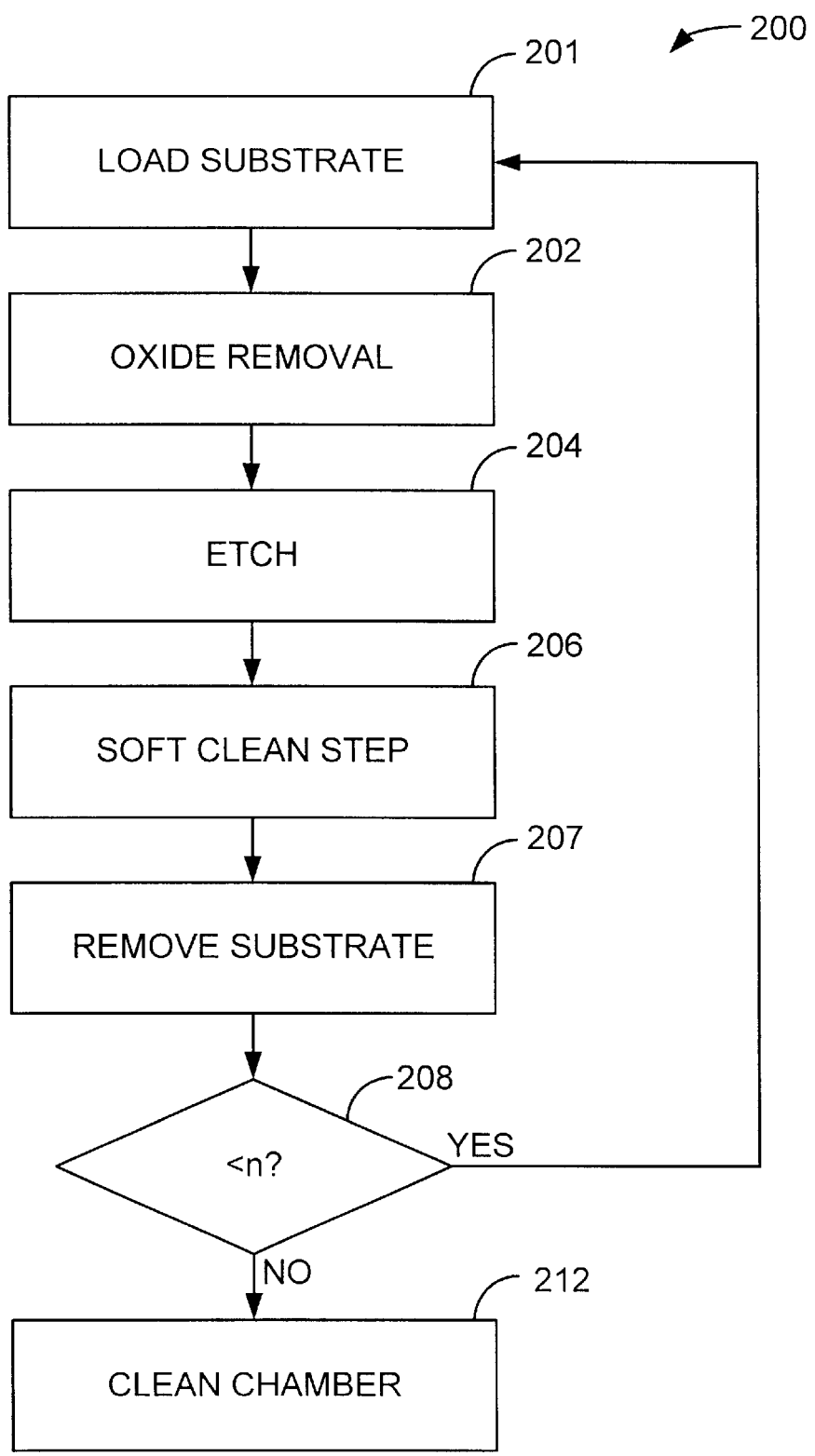
FIG. 3 shows a flow chart of an exemplary process according to one embodiment of the present invention.

The anisotropic etch process of FIG. 3, step 204, is referred to as a dirty process because the polymerization and ion bombardment produce byproducts which adhere to the inner surfaces of chamber 101. These byproducts accumulate within the chamber and alter the chamber condition unless they are regularly removed. Additionally, the ion bombardment damages crystal structure at the outer surfaces of the substrate, producing a damaged layer (not shown in FIG. 2B) with a thickness of 20–100 Å, which alters the electrical properties of the substrate among other things. The ion bombardment also makes the substrate surfaces rough, which increases steps, subsurface reflections and the likelihood of cracking.

After the trench has been formed, a soft clean step (step 206) is performed to remove the byproducts adhering to the inner surfaces of the chamber, without meaningfully altering the main trench profile, i.e., the width, depth and slope of the trench. Under the conventional paradigm of semiconductor fabrication process, engineers perform cleaning steps on the chamber only after removing the substrate being processed from the chamber for the fear of altering the profile etched and damaging the substrate. The present inventors, however, have unexpectedly discovered that integrating the soft clean step to the silicon etch process, i.e., performing the soft clean step with the substrate in the chamber, provides many unexpected benefits. For example, the integrated etch process discovered by the inventors allows a greater number of substrates to be processed between wet clean steps than under the conventional method. In addition, in some instances, the soft clean step may even alleviate the need for dry clean steps.

Figure 2C:
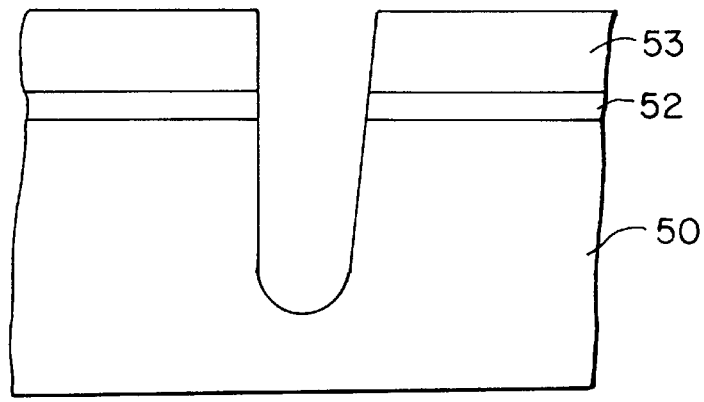
FIG. 2C shows a simplified cross-sectional view of the semiconductor substrate of FIG. 2B after a soft clean step has been performed.

The soft clean step primarily involves a chemical process, i.e., turning off or applying a minimal bias power (e.g., no more than 20 Watts or 0.06 Watt/cm$^2$) to chamber 101 to eliminate or at least minimize further physical etching which produces byproducts. The main trench profile is not meaningfully altered by the soft clean step because passivation layer 56 protects the upper portions of the trench. However, the soft clean step rounds the bottom corners of the trench, as shown in FIG. 2C, because the passivation layer tapers off at those corners. Rounding the bottom corners of the trench improves the step coverage and improves device performance. The soft clean step also removes the damaged layer at the surfaces of the substrate as it removes the byproducts and rounds the bottom corners.

The chemistry of the soft clean step is different than the chemistry of the anisotropic etch step. The soft clean step includes flowing a process gas having one or more halogen sources such as $SF_6$, $CF_4$, $C_2F_6$, $C_3F_8$, $C_4F_8$, $NF_3$ and $CHF_3$. Preferably, the process gas also includes a source (e.g., oxygen source) which enhances the dissociation of halogen sources, or an inert gas (e.g., argon) which alters the plasma distribution pattern, or both. The oxygen source and the like enhance dissociation of halogen sources but also produce byproducts. Therefore, the optimal amount of oxygen source or the like for a particular process gas must be determined for the particular process gas used. For example, for one particular soft clean process where the process gas consists essentially of $CF_4$ as the halogen source, the inventors have determined that the optimal gas flow range for $O_2$ is between about 10 percent to about 40 percent of the gas flow rate of $CF_4$, more preferably the gas flow rate for $O_2$ is about 20 percent of the gas flow rate of $CF_4$. An inert gas such as argon may be included in the process gas to more evenly distribute the halogen source within the chamber. The optimal duration of the soft clean step varies for different trench etch processes. For example, the soft clean step needs to be run for a longer time for an etch process which generates more byproducts.

After the soft clean step, the substrate is removed from the chamber (step 207). A determination is made as to whether or not the chamber needs to be cleaned using a wet clean process due to the byproduct accumulation (step 208). This determination may be made in many different ways. In one embodiment of the invention, it is decided prior to performing process 200 that the chamber shall be cleaned after every n process-runs, where n can be any integer. The appropriate number for n for a particular process may be determined by experimentation. According to one embodiment, the chamber may not require wet cleaning even after 10,000 process runs, so that n may be a number greater than 10,000, a dramatic improvement over the conventional method which generally requires a wet clean step every 1,500 or so process-runs. In addition, this improved result may be obtained without performing any dry cleaning steps between wet clean processes. Referring back to step 208, if the chamber does not need to be cleaned (i.e., less than n process-runs have been performed), another substrate is loaded into the chamber and the steps 201–207 are repeated. On the other hand, if the chamber needs to be cleaned (i.e., n number of process-runs have been performed), the chamber is cleaned with either a dry clean step or wet clean step, or both (step 212).

As used herein, the dry clean step or dry cleaning refers to a cleaning process performed after removing the substrate being processed from the chamber, where a plasma ignited from a cleaning gas mixture is used to remove byproducts adhering on the inner surfaces of the etch system. Generally, a dummy wafer is inserted into the chamber before igniting the "cleaning plasma." The wet clean step or wet cleaning refers to a cleaning process where the chamber is emptied and a cleaning liquid is used to remove byproducts adhering on the inner surfaces of the etch system.

Referring back to the soft clean step, Table 2 below provides acceptable ranges for the chamber pressure, bias power, source power, and the like for the soft clean step according to one embodiment of the present invention.

TABLE 2

Process Recipe

| | Soft Clean Step |
|---|---|
| Pressure | 2–100 mT |
| $W_b$ | 0–50 Watts |
| | (0–0.16 Watts/cm$^2$) |
| $W_s$ | 300–1,500 Watts |
| $CF_4$ | 10–400 sccm |
| Ar | 0–400 sccm |
| $O_2$ | 0–200 sccm |
| Time | 5–100 sec |

In one experiment, process 200 was carried out using the soft clean step with the following process recipe in a DPS+ chamber manufactured by Applied Materials, which is outfitted for eight inch wafers. The soft clean step was performed for 20 seconds. Chamber pressure was held at low pressure, e.g., 10 mT. A process gas was flowed into the chamber at the flow rate of 60 sccm of $CF_4$, 12 sccm of $O_2$ and 120 sccm of Ar. Source power supply 105 was controlled to apply 1200 Watts of RF power at a frequency of 12.56 MHz to antenna 102 to ignite a plasma from the process gas. Bias power supply 106 was grounded to minimize high speed ion bombardment against the substrate. Process 200 was carried out 3,000 times without performing any dry or wet clean step. The chamber remained clean even after running the process for 3,000 times. The experiment was terminated after running 3,000 etch processes because the substrate supply was exhausted. Based on the clean condition of the chamber after running 3,000 etch processes, the inventors believe that process 200 could have been run for an additional 5,000–10,000 times without performing any dry or wet clean step. In comparison, a typical etch process performed without the soft clean step generally needs to be dry cleaned every 25 to 75 processes and wet cleaned about every 1,500 processes, as explained previously.

Figure 4A:
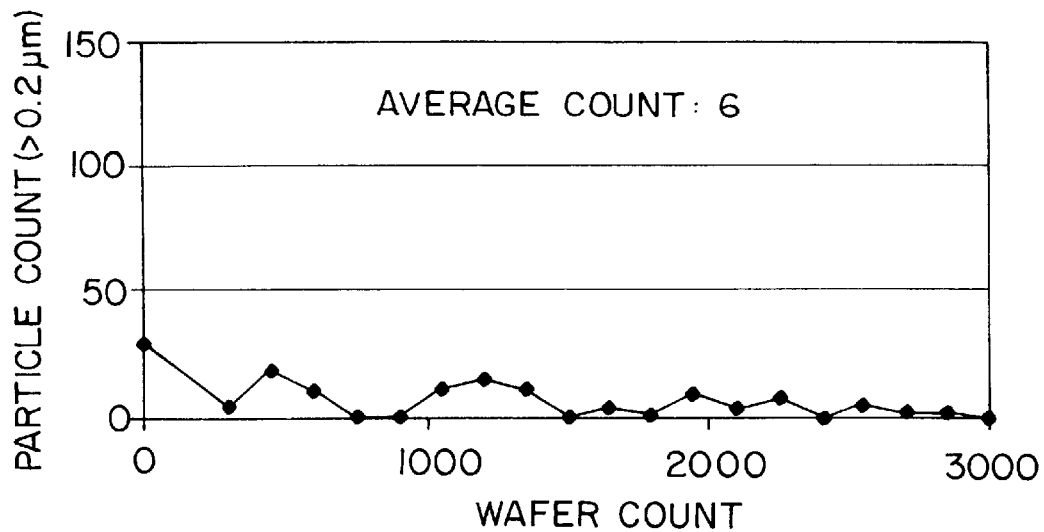
FIGS. 4A and 4B show the particle performance for the extended substrate runs using the exemplary process provided in FIG. 3.
Figure 4B:
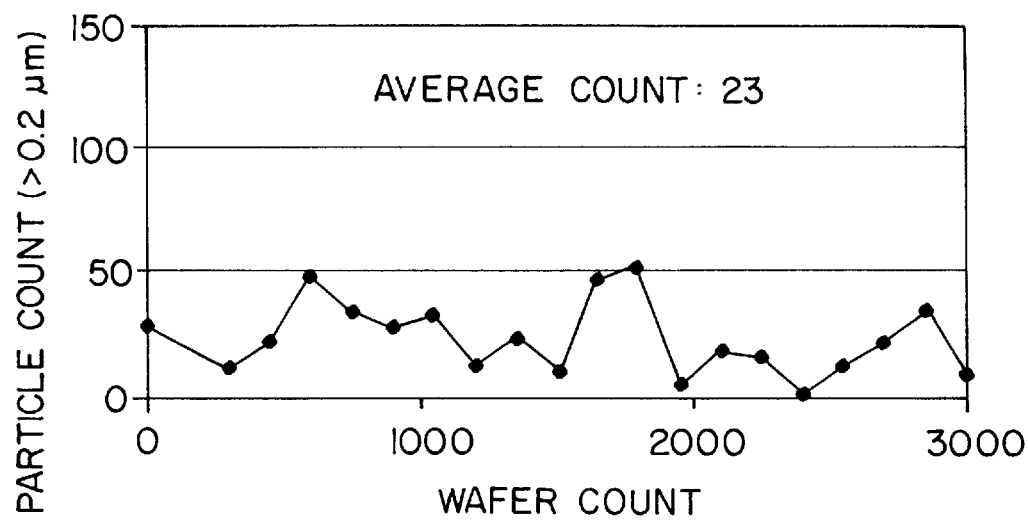

FIG. 4A and 4B are graphs illustrating the particle performance for the extended run of substrates using process 200 discussed above. The x-axis of the graphs shows the number of substrates runs performed, and the y-axis of the graphs shows the number of particle adders found on a test substrate. The particle adders are particles or byproducts that are greater than 0.2 $\mu$m in width that are found on the test substrate as a result of performing the test below. FIG. 4A shows the results of the mechanical particle performance test performed by the inventors. The test involved performing extended substrate runs using process 200. After every fifty substrate runs, a clean substrate with an N number of particles was inserted into the chamber and removed from the chamber. The mechanical motion involved with this procedure caused some of the byproducts adhering inside of the chamber to fall onto the test substrate. The number of byproducts that is greater than N with width greater than 0.2 $\mu$m was deemed the number of particles added (i.e., number of particle adders) as a result of the mechanical motion. Such a test was repeated every fifty process-runs until 3000 substrates were processed. As shown in FIG. 4A, the particle count did not show any noticeable spike throughout the 3000 process-runs, indicating that the chamber remained clean throughout the extended substrate runs.

Referring to FIG. 4B, an RF-on particle performance test, a well known experiment, also shows that the chamber remained clean after 3000 process-runs. The test involved performing an extended process-runs using process 200. After every fifty process-runs, a test substrate having an N number of particles was inserted into the chamber. A source power is applied to the chamber to ignite a plasma within the chamber for a brief period and then turned off. The test substrate was removed from the chamber, and the particle adders on the test substrate were counted. This procedure was repeated until 3000 substrate runs have been performed. As shown by FIG. 4B, there was no spike in the particle count which indicates the chamber remained clean through the 3000 substrate runs.

Figure 5A:
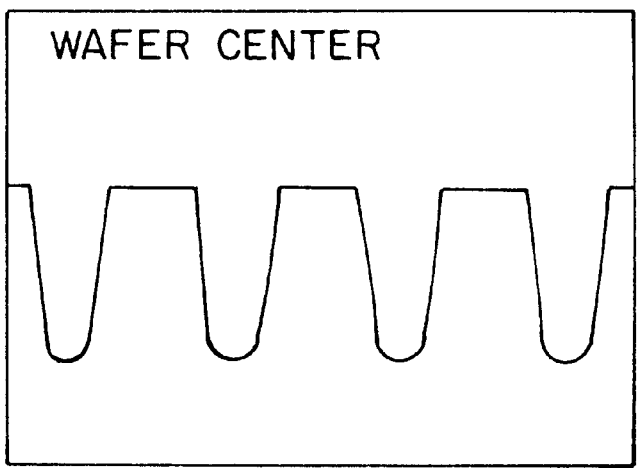
FIGS. 5A and 5B are sketches of SEM photographs of the trench profile made on the first substrate processed according to the process provided in FIG. 3.
Figure 5B:
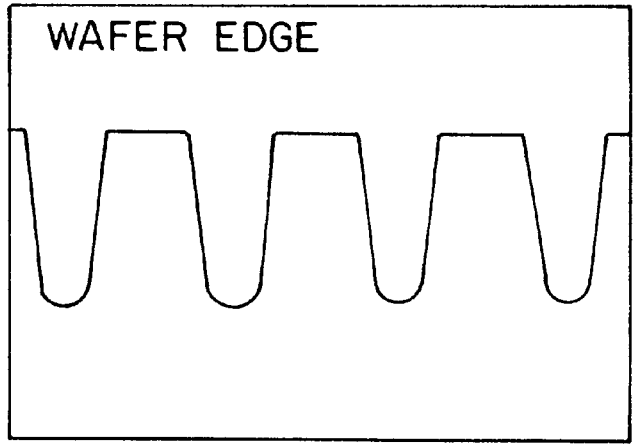
Figure 6A:
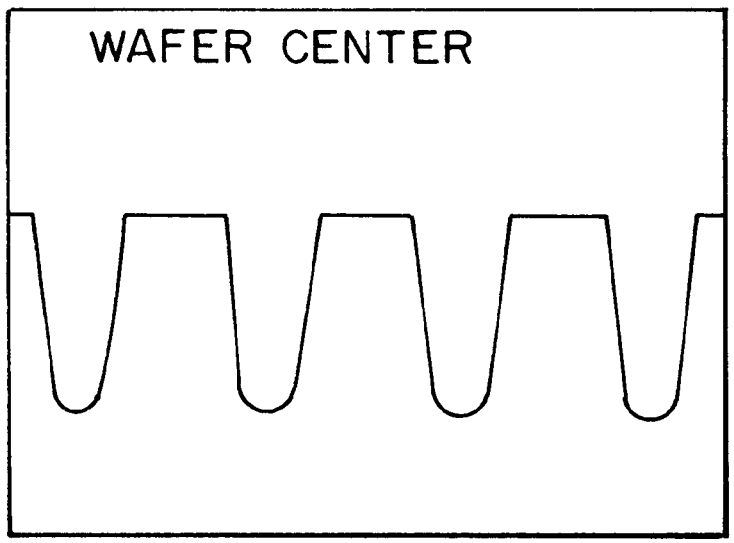
FIGS. 6A and 6B are sketches of SEM photographs of the trench profile made on the 3,000th substrate processed according to the process provided in FIG. 3.
Figure 6B:
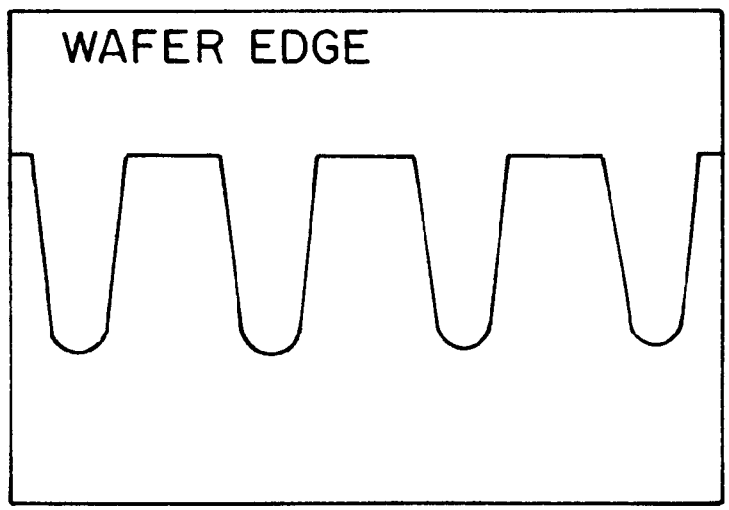

In addition to the above, the experiment showed that process 200 provides a good repeatability. FIGS. 5A and 5B show the trench profiles of the first substrate processed, where FIG. 5A and FIG. 5B, respectively, show the profiles formed at the center and the edge of the substrate. FIGS. 6A and 6B show the trench profiles of the 3,000th substrate processed, where FIG. 6A and FIG. 6B, respectively, show the profiles formed at the center and the edge of the substrate. The trench profiles formed at the center are substantially identical for the first substrate and for the 3,000th substrate. Similarly, the trench profiles formed at the edge are substantially identical for the first substrate and for the 3,000th substrate.

Figure 7A:
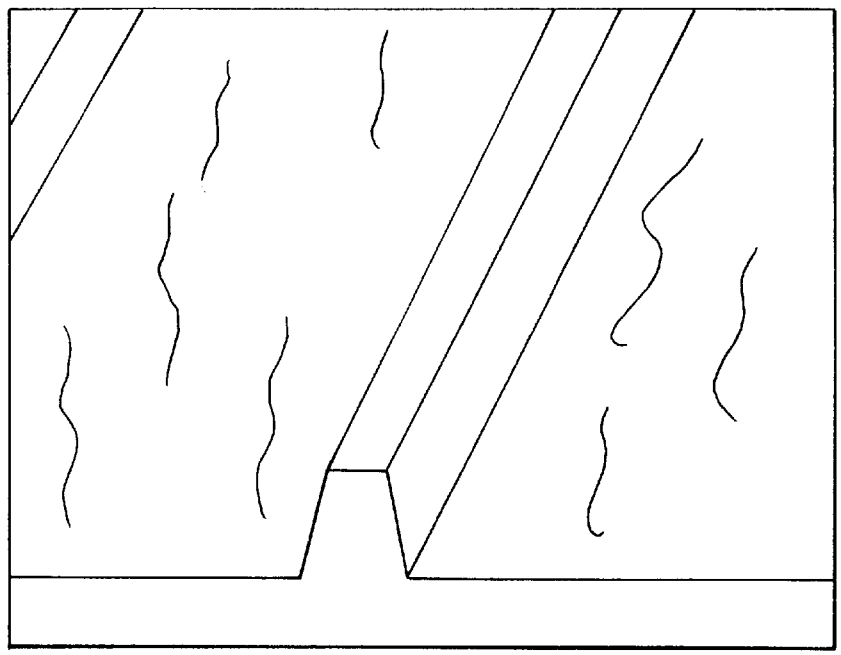
FIG. 7A is a sketch of a SEM photograph of the surfaces of a trench formed with a conventional trench etch process.
Figure 7B:
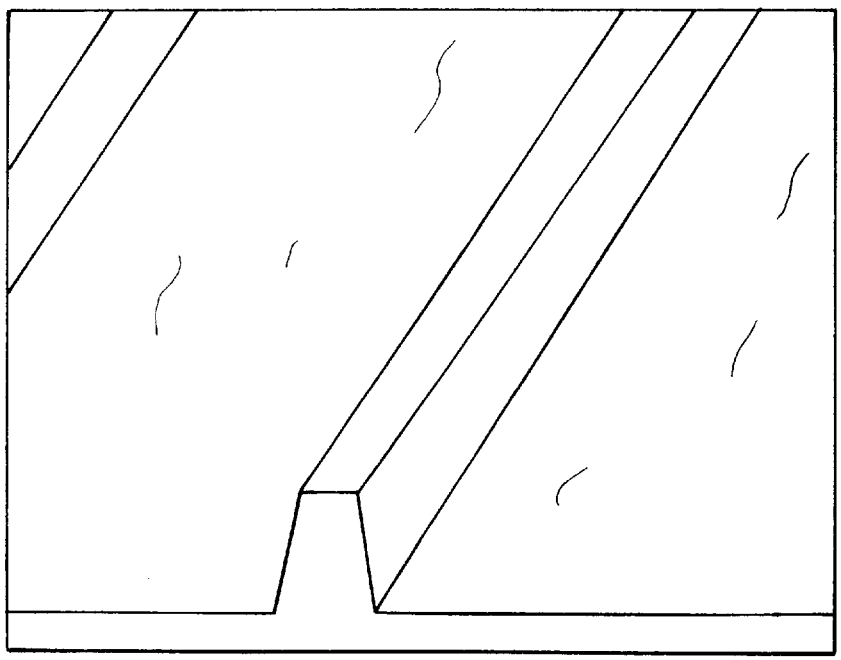
FIG. 7B is a sketch of a SEM photograph of the surfaces of a trench formed with the process provided in FIG. 3.
Figure 8:
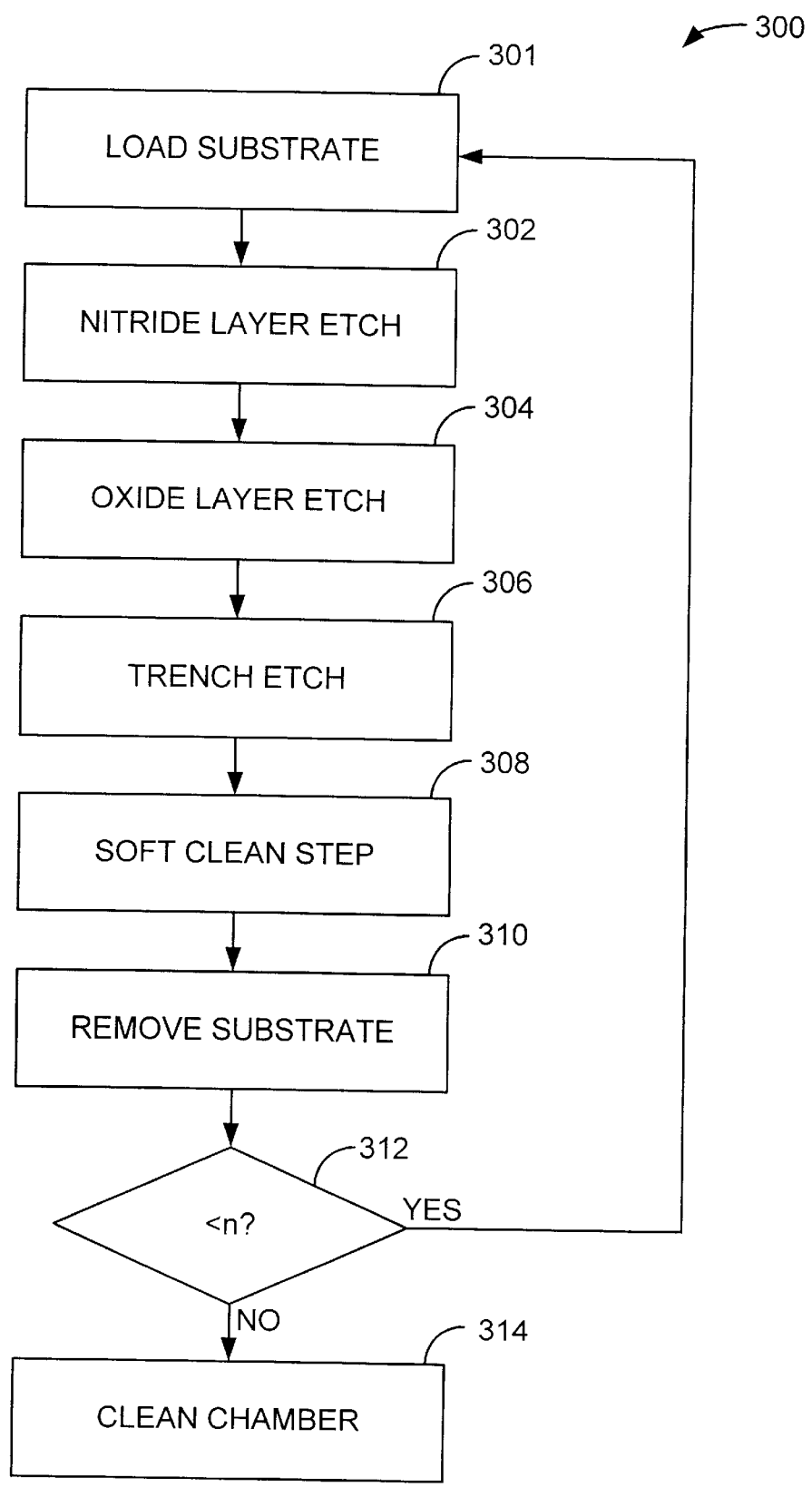
FIG. 8 shows a flow chart of a exemplary process according to another embodiment of the present invention.

The inventors also discovered that the above implementation of the soft clean step provides a trench with smooth surfaces. It is believed that argon in the process gas polishes the surface made rough by the trench etch step which uses ion bombardment. That is, argon with zero or minimal bias power polishes the surfaces of the substrate as it flows over the substrate at relatively slow speed. FIG. 7A shows a photograph of a trench formed with a conventional etch process. FIG. 7B shows a photograph of a trench formed with process 200, which includes the soft clean step described above. The surface of the trench in FIG. 7B appears to be considerably smoother than the surface of the trench in FIG. 7A.

Figure 9A:
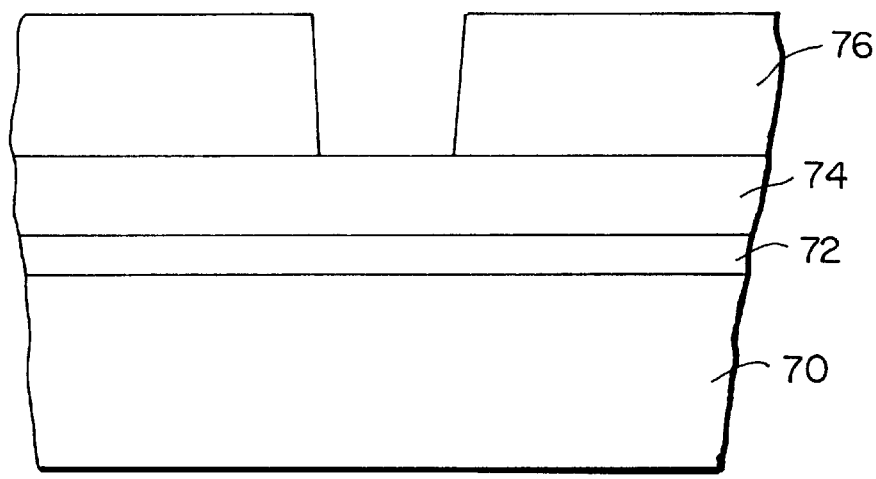
FIG. 9A shows a simplified cross-sectional view of the semiconductor substrate having a patterned photoresist.
Figure 9B:
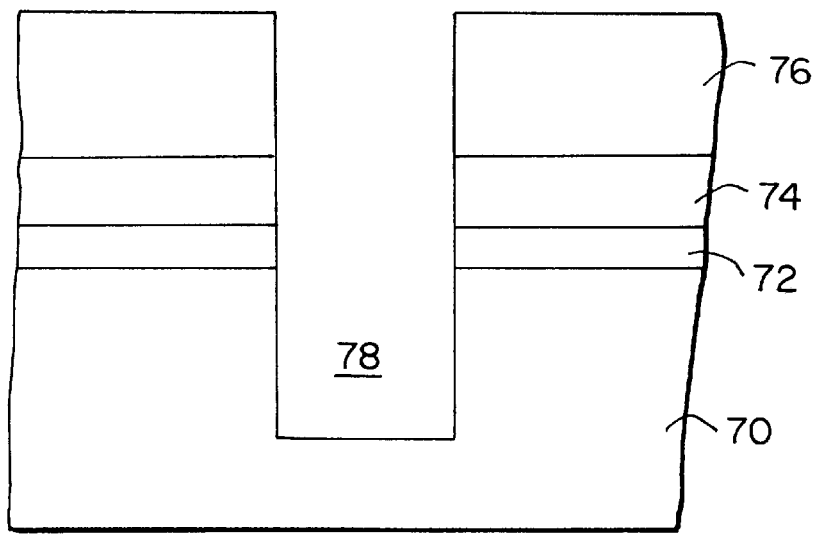
FIG. 9B shows a simplified cross-sectional view of the semiconductor substrate of FIG. 9A after an in-situ shallow trench isolation process has been performed.

In another embodiment, the soft clean step described above may be used in conjunction with formation of an in-situ shallow trench isolation. Referring to FIG. 9 and FIGS. 9A–B, a process 300 (FIG. 7) includes placing a substrate 70 on pedestal 107 of process chamber 101 (step 301). The substrate has a pad oxide layer 72 provided thereon, a nitride layer 74 provided over the pad oxide layer, and a patterned photoresist 76 provided over the nitride layer. The nitride layer and the oxide layer are opened sequentially using well-known etch techniques (steps 302 and 304). A trench 78 is etched using a well-known anisotropic etch technique (step 306). A soft clean step is performed to remove the byproducts adhering to the inner surfaces of the chamber (step 308). Alternatively, the soft clean step may be performed in any sequence, e.g., either before or after the nitride layer removal step, to remove the byproducts. However, the soft clean step is preferably performed after the trench etch step to obtain additional benefits such as removal of a damaged silicon layer on the sidewalls of trench 78 and rounding of the bottom corners of trench 78.

After the soft clean step, the substrate is removed from the chamber (step 310). It is then determined whether or not to clean the chamber to remove the accumulated byproducts (step 312). This determination may be made in various ways, of which one method is described below. According to this method, it may be decided prior to performing process 300, based on experimentation, that the chamber shall be cleaned after every n process-runs (e.g., 1,000 process-runs). At step 312, if the process-run has been performed less than n times, another substrate is loaded into the chamber and steps 301–309 are repeated. On the other hand, if n number of process-run has been performed, the chamber is cleaned with a dry clean step or wet clean step, or both (step 314).

The gas flow rates and RF power levels described herein are based on etch processes run in a DPS+ chamber manufactured by Applied Materials that is outfitted for eight inch wafers. A person of ordinary skill in the art will recognize that these values are in part chamber specific and may vary if chambers of other design and/or volume are employed.

While the foregoing is directed to certain preferred embodiments of the present invention, other and further embodiments of the invention may be devised without departing from the basic scope of the invention. For example, one such alternative may employ the soft clean step before the trench etch step. In another embodiment, the soft clean step may be employed with a deep trench etch process, or other silicon etch process. These alternatives along with other alternatives and equivalents are intended to be included within the scope of the present invention.

What is claimed is:

1. A method for processing a silicon substrate disposed in a substrate process chamber of the type having a source power system and a bias power system, the method comprising:

transferring the substrate into the substrate process chamber;

etching a trench on the substrate by exposing the substrate to a plasma formed from a first etchant gas by applying RF energy from the source power system and biasing the plasma toward the substrate;

without substantially etching the substrate nor substantially altering a profile of an upper portion of the trench, removing etch byproducts adhering to inner surfaces of the substrate process chamber by igniting a plasma formed from a second etchant gas including a halogen source in the substrate process chamber while applying bias power of no more than about 0.06 Watts/cm$^2$; and thereafter, removing the substrate from the chamber.

2. The method of claim 1 wherein the halogen source is selected from the group of $SF_6$, $CF_4$, $C_2F_6$, $C_3F_8$, $C_4F_8$, $CHF_3$ and $NF_3$.

3. The method of claim 1 wherein the second etchant gas includes a source which enhances the dissociation of the halogen source included in the second etchant gas.

4. The method of claim 1 wherein the second etchant gas includes an inert gas.

5. The method of claim 4 wherein the inert gas is argon.

6. The method of claim 1 wherein the second etchant gas includes $CF_4$ and $O_2$.

7. The method of claim 6 wherein the gas flow of $O_2$ is about twenty percent of that of $CF_4$.

8. The method of claim 6 wherein the second etchant gas further includes Ar.

9. The method of claim 1, wherein the removing step is performed before the etching step.

10. The method of claim 1, further comprising:

processing at least 100 substrates with the etching-a-trench step and removing-etch-byproducts step before performing either a dry clean or wet clean operation on the chamber.

11. The method of claim 10, wherein at least 1000 more substrates are processed with the etching-a-trench step and removing-etch-byproducts step before performing either the dry clean or wet clean operation on the chamber.

12. The method of claim 11, wherein at least 3000 more substrates are processed with the etching-a-trench step and removing-etch-byproducts step before performing either the dry clean or wet clean operation on the chamber.

13. The method of claim 1, wherein the removing step rounds bottom corners of the trench.

14. The method of claim 1, wherein no bias power is applied during the removing step.

15. A method of etching a trench in a silicon substrate disposed in a substrate process chamber of the type having a source power system and a bias power system, the method comprising:

(a) transferring the substrate into the chamber;

(b) etching the trench on the substrate using an anisotropic plasma etch process;

(c) thereafter, exposing the etched trench to a plasma formed from an etchant gas consisting essentially of an oxygen source, a halogen source, and an inert gas without biasing the plasma toward the substrate;

(d) transferring the substrate out of the chamber; and (e) processing at least 100 more substrates using the steps (a)–(d) above without performing either a dry or wet clean step.

16. The method of claim 15, wherein at least 1000 more substrates are processed using the steps (a)–(d) without performing the dry or wet clean step.

17. The method of claim 15, wherein the anisotropic plasma etch process includes:

applying bias power to the chamber to bias the plasma toward the substrate;

flowing a gas mixture consisting essentially of $Cl_2$, $N_2$, and $O_2$ into the chamber; and igniting a plasma from the gas mixture.

18. The method of claim 15, wherein the step (c) includes:

turning off the bias power being applied to the chamber;

flowing the etchant gas consisting essentially of $CF_4$, $O_2$ and Ar; and igniting a plasma from the etchant gas.

19. The method of claim 15, wherein the step (c) does not substantially alter a profile of an upper portion of the trench.

20. The method of claim 19, wherein the step (c) rounds bottom corners of the trench.

21. A method of integrating substrate processing and chamber cleaning steps, wherein a substrate is disposed in a process chamber to etch the substrate, the method comprising:

transferring the substrate into the process chamber;

exposing the substrate to a plasma ignited from a first process gas to etch a trench on the substrate by applying bias power to the process chamber;

removing etch byproducts adhering to the process chamber without substantially etching the substrate nor substantially altering a profile of an upper portion of the trench by exposing the chamber to ions and radicals dissociated in a second plasma formed from a second process gas which includes a halogen gas while applying bias power of no more than about 0.06 Watts/cm$^2$;

thereafter, removing the processed substrate from the chamber; and processing at least 3000 more substrates with the exposing-the-substrate step and removing-etch-byproducts step before cleaning the chamber with either dry clean or wet clean step.

22. The method of claim 21 wherein the second plasma is ignited remote from the process chamber.

23. The method of claim 21 wherein the minimal power is about 0.06 Watts/cm2.

24. A method of forming a trench on a silicon substrate disposed in a substrate process chamber, the method comprising:

exposing the substrate to a plasma formed from a first etchant gas by applying RF energy from a source power system and biasing the plasma toward the substrate by applying bias power to the substrate process chamber to etch the trench; and igniting a plasma formed from a second etchant gas consisting essentially of $CF_4$, $O_2$ and Ar in the substrate process chamber while applying bias power of no more than about 0.06 Watts/cm$^2$ to remove etch byproducts adhering to inner surfaces of the substrate process chamber and round bottom corners of the trench without substantially etching the substrate nor substantially altering a profile of an upper portion of the trench.

25. The method of claim 13, wherein the removing step does not substantially alter a slope of the trench or a width of the opening of the trench or the depth of the trench.

26. The method of claim 13, wherein the removing step does not substantially alter the depth of the trench.

* * * * *